(12) United States Patent
Silver

(10) Patent No.: US 6,457,032 B1
(45) Date of Patent: Sep. 24, 2002

(54) EFFICIENT FLEXIBLE DIGITAL FILTERING

(75) Inventor: William Silver, Weston, MA (US)

(73) Assignee: Cognex Corporation, Natick, MA (US)

( * ) Notice: Subject to any disclaimer, the term of this patent is extended or adjusted under 35 U.S.C. 154(b) by 0 days.

(21) Appl. No.: 08/971,241

(22) Filed: Nov. 15, 1997

(51) Int. Cl.$^7$ ............................................... G06F 17/10
(52) U.S. Cl. ...................................... 708/315; 708/319
(58) Field of Search ....................... 364/724.12, 724.16; 708/315, 319

(56) References Cited

U.S. PATENT DOCUMENTS 5,351,314 A   9/1994  Vaezi
5,511,015 A * 4/1996  Flockencier ........... 364/724.12

OTHER PUBLICATIONS

Wells, III, William M., "Efficient Synthesis of Gaussian Filters by Cascaded Uniform Filters," *IEEE Transactions on Pattern Analysis and Machine Intelligence*, Mar. 1986, pp. 234–239, vol. PAMI–8, No. 2.

Burt, Peter J., "Fast Algorithms for Estimating Local Image Properties," *Computer Vision, Graphics, and Image Processing 21*, 1983, pp. 368–382, Academic Press, Inc.

Burt, Peter J., "Fast Hierarchical Correlations with Gaussian–Like Kernels," two pages, Computer Vision Laboratory, Computer Science Center, University of Maryland, College Park, MD, USA.

Canny, John Francis, "Finding Edges and Lines in Images," Artificial Intelligence Laboratory of the Massachusetts Institute of Technology, Jun. 1983, pp. 2–145, Cambridge, MA, USA.

Law, Todd, "Image Filtering, Edge Detection, and Edge Tracing using Fuzzy Reasoning," *IEEE Transactions on Pttern Analysis and Machine Intelligence*, May 1996, pp. 481–491, vol. 18, No. 5.

\* cited by examiner

*Primary Examiner*—David H. Malzahn
(74) *Attorney, Agent, or Firm*—Russ Weinzimmer

(57) ABSTRACT

A system is provided for digitally processing a one-dimensional digital signal, including convolving the one-dimensional digital signal with a function that is the $(n+1)^{th}$ difference of an $n^{th}$ order discrete piecewise polynomial kernel so as to provide a second one-dimensional digital signal. Here, 'n' is at least 1, the polynomial kernel has a plurality of non-zero elements, the function has a plurality of non-zero elements and at least one zero element, and the function has fewer non-zero elements than the polynomial kernel has non-zero elements. Then, the second one-dimensional digital signal is discretely integrated n+1 times. Also, multi-dimensional signals are dimensionally separated and processed using a function for each dimension. In addition to providing parabolic kernels and approximate Gaussian kernels, the invention can provide many other filter shapes, thereby allowing unprecedented flexibility in matching filter specifications to particular signal processing applications, while also providing high computational efficiency.

108 Claims, 10 Drawing Sheets

EFFICIENT FLEXIBLE DIGITAL FILTERING

FIELD OF THE INVENTION

The invention relates to digital signal processing, and particularly to digital filtering.

BACKGROUND OF THE INVENTION

Digital signals are often filtered to enhance signal components of certain characteristics, and to attenuate components of other characteristics. For example, in digital image processing, a "low-pass" filter may be used to pass coarse image features, and to attenuate fine detail, texture, and noise. A "high-pass" filter may be used to enhance object boundaries, and to attenuate regions of nearly uniform signal intensity. Since signal features can occur over a wide range of characteristics, it is useful to be able to adjust the response of a filter over a wide range.

Digital filters are often implemented by a method in which each signal value is replaced by a weighted average of the signal value and a set of neighboring signal values. This method is known as "convolution", the set of weights arranged in a particular pattern is known as a "kernel", and the weights themselves, which can be positive, zero, or negative, are known as "kernel elements". Convolution is particularly important in digital image processing, where symmetrical, non-causal filters such as Gaussian and Laplacian approximations are common.

The size of a kernel is defined to be the size of the smallest region containing all of the kernel's non-zero elements. The ability to adjust the response of a filter over a wide range is largely dependent on the ability to adjust the size of the corresponding kernel over a wide range, because adjusting the weights without adjusting the size has a relatively small effect on the response.

In the general case, convolution is expensive (i.e., requires excessive computational resources), particularly as kernel size increases, and particularly for 2D signals such as images, where computation cost is proportional to the square of the kernel size. The expensive nature of convolution-style filtering can be ameliorated by several methods used separately or in combination.

One method commonly used with image processors that support small, fixed kernel sizes involves performing the convolution multiple times, in effect cascading the corresponding filters to produce the effect of a filter having a much larger kernel. Although this method saves little or no time for 1D signals, significant time is saved for signals having two and higher dimensions. In general, this method works well only for filters that are approximately Gaussian, and is still too expensive for many practical applications.

Another method (i.e., Burt's method as described in William M. Wells, III, Efficient Synthesis of Gaussian Filters by Cascaded Uniform Filters, IEEE TRANSACTIONS ON PATTERN ANALYSIS AND MACHINE INTELLIGENCE, Vol. PAMI-8, No. 2 (March 1986) ("Wells"); P. J. Burt, "Fast, hierarchical correlations with Gaussian-like kernels," Comput. Vision Lab., Univ. Maryland, Tech. Rep. TR-860, January 1980; and P. J. Burt, "Fast algorithms for estimating local image properties," Comput. Vision, Graphics, Image Processing, vol. 21, pp. 368–382, March 1983, incorporated herein by reference) involves increasing the kernel's size without increasing the computational cost, by inserting zero elements between a fixed number of non-zero elements. With this method, although the computational cost involved is reduced, in practice if a kernel is expanded over more than a small range, the quality of the filter's output becomes unacceptable.

Many methods for implementing multidimensional filters take advantage of the fact that many important filters (including Gaussian and Laplacian approximations) are separable, which means that each dimension of the input signal can be processed separately with a 1D filter that corresponds to the multi-dimensional filter. This reduces the computational cost problem to one of finding inexpensive methods for 1D filtering. The methods described below are based on separable filters.

John F. Canny, Finding Edges and Lines in Images, Artificial Intelligence Laboratory, Massachusetts Institute of Technology, Catalog Number AD-A130824 (June 1983) ("Canny"), incorporated herein by reference, describes a method in which a Gaussian filter is approximated by using recursive filters. The response of a recursive filter can be adjusted over a wide range without affecting the computational cost. Since recursive filters are causal and asymmetric, the Canny method applies them in forwards and backwards directions and sums the results to approximate the symmetric Gaussian. The Canny method also applies the filters twice to improve the quality of the approximation.

Methods for convolving a signal with a uniform kernel (also known as a "boxcar" kernel) have also been developed. The elements of a uniform kernel have uniform values within a region, and have values of zero outside this region. Uniform multidimensional kernels are separable, allowing for uniform 1D convolution that can be performed with a small, fixed number of operations where the small fixed number is independent of the size of the kernel.

Wells describes a method for approximating a Gaussian filter by repeated convolution with uniform kernels. According to Wells, a cascade of uniform filters approximates a Gaussian due to the central limit theorem. It is noted that the approximation improves as the number of repeated convolutions increases, and is good after three such convolutions.

A limitation of the prior art methods is that in order to reduce computational cost, considerable flexibility in choosing the shape of the filter is sacrificed. All of the above described methods in which computational cost is independent of kernel size involve Gaussian approximations or boxcar filters. Although Gaussian filters are important in image processing, and different sized Gaussian filters can be combined to approximate band-pass and high-pass filters, there are often practical reasons to prefer other shapes not readily possible using the prior art methods.

Another limitation is that even when Gaussian filtering is desired, the prior art methods are not well-suited to widely-available, inexpensive digital hardware, including specialized circuits and general purpose computers. Although some researchers have taken computational cost into account, typically this has been only in terms of arithmetic operations such as addition and multiplication. With practical digital hardware, particularly modern general purpose computers that have effectively single-clock-cycle multipliers, the number and pattern of memory accesses has a more significant effect on computational cost than the number of arithmetic operations.

For cost and performance reasons, a digital signal processor (including a general purpose computer being used for that purpose) typically provides at least three levels of memory. The lowest level is a small (typically fewer than 128 bytes) register file having an access computational cost of essentially zero. The next level is a medium-sized bank (typically a few tens of kilobytes) of static random access memory ("SRAM") having an access computational cost about the same as the computational cost of an addition or multiplication, independent of the pattern of access. The final level is a large, dynamic random access memory ("DRAM") in which source and destination images are held. Data is copied from DRAM to SRAM to be accessed by the computer's processor. The access computational cost for this copying is typically equivalent to the SRAM access computational cost for long sequential access patterns, but is much higher for short or non-sequential patterns.

The Wells and Canny methods are computationally costly because they generate a significant quantity of intermediate data that is held in memory. For the 1D case, this data does not fit in the register file, so an access cost penalty equivalent to the arithmetic computational cost of an addition or multiplication operation is paid for each piece of data read or written. For separable 2D filtering, data along one dimension (i.e., rows) is sequential in DRAM, while data along the other dimension (i.e., columns) is not sequential, and therefore is slow to gain access to in sequence. To achieve high performance, it is necessary to gain access to and filter many neighboring columns at once, but the intermediate data generated quickly fills all available SRAM and results in significant copying between SRAM and DRAM.

Moreover, the Canny method requires many arithmetic operations, resulting in unacceptably high computational costs in some applications.

High speed industrial guidance and inspection applications, among others, would benefit from higher performance digital filtering executed on inexpensive digital hardware, and would also benefit from more flexibility in specifying the shape of digital filter kernels.

SUMMARY OF THE INVENTION

The invention provides an apparatus, a method, and computer software residing on a computer-readable storage medium, for digitally processing a one-dimensional digital signal. The invention includes convolving the one-dimensional digital signal with a function that is the $(n+1)^{th}$ difference (discrete derivative) of an $n^{th}$ order discrete piecewise polynomial kernel so as to provide a second one-dimensional digital signal. Further according to the invention, 'n' is at least 1, the polynomial kernel has a plurality of non-zero elements, the function has a plurality of non-zero elements and at least one zero element, and the function has fewer non-zero elements than the polynomial kernel has non-zero elements. Next, discrete integration is performed n+1 times on the second one-dimensional digital signal, thereby providing a digitally processed one-dimensional signal.

In preferred embodiments of the invention, convolving includes performing computations that involve only the non-zero elements of the function; the polynomial kernel includes at least one selectable parameter, each selectable parameter determining a respective property of the polynomial kernel; a selectable parameter determines size of the polynomial kernel; 'n' is a selectable parameter of the polynomial kernel; a selectable parameter determines the number of pieces of the polynomial kernel; all of the elements of the function are integers; 'n' has value 2; the function includes 's' zero elements between each pair of neighboring non-zero elements, where 's' is a positive integer; there are four non-zero elements of the function, these elements having respective values +1m, −3m, +3m, −1m, where 'm' is a non-zero integer; for at least one non-zero element of the function there are at least two zero elements; the at least one selectable parameter is a positive integer 's', and the function includes first, second, third, and fourth non-zero elements having values +m(s+1), −m(s+3), +m(s+3), −m(s+1) respectively, where 'm' is a non-zero integer, and the function further includes 's' zero elements between the second and third non-zero elements.

The invention also provides an apparatus, method, and computer software on a storage medium for digitally processing a multi-dimensional digital signal, such as an image. The invention includes, for at least one dimension of the multi-dimensional digital signal, convolving a corresponding one-dimensional digital signal with a corresponding function that is the $(n+1)^{th}$ difference of a corresponding $n^{th}$ order discrete piecewise polynomial kernel so as to provide a second multi-dimensional digital signal. Further according to the invention, 'n' is at least 1, each polynomial kernel has a plurality of non-zero elements, each function has a plurality of non-zero elements and a plurality of zero elements, and each function has fewer non-zero elements than the polynomial kernel has non-zero elements. Then, for each convolved dimension, the second multi-dimensional digital signal is discretely integrated n+1 times, where n is the order of the polynomial kernel corresponding to the dimension.

In preferred embodiments of this general aspect of the invention, convolving includes performing computations that involve only the non-zero elements of the corresponding function; each polynomial kernel includes at least one selectable parameter, each selectable parameter determining a respective property of the polynomial kernel; a selectable parameter determines size of each polynomial kernel; 'n' is a selectable parameter of each polynomial kernel corresponding to each dimension; a selectable parameter determines a number of pieces of each polynomial kernel along each dimension; all of the elements of each function are integers; 'n' has value 2; each function includes 's' zero elements between each pair of neighboring non-zero elements, where 's' is a positive integer corresponding to each dimension; there are four non-zero elements of each function, these elements having respective values +1m, −3m, +3m, −1m, where 'm' is a non-zero integer corresponding to each dimension; for at least one non-zero element of each function there are at least two zero elements; and the at least one selectable parameter is a positive integer 's', and each function includes first, second, third, and fourth non-zero elements having values +m(s+1), −m(s+3), +m(s+3), −m(s+1) respectively, where 'm' is a non-zero integer, and each function further includes 's' zero elements between the second and third non-zero elements.

Among the advantages of the invention are one or more of the following. The invention allows one dimensional digital filtering and separable multidimensional digital filtering. A variety of basic kernel shapes can be used. For any such basic kernel shape, the kernel size, and consequently the response of the filter, can be adjusted over a wide range at a computational cost that is substantially independent of the size of the kernel. The amount of intermediate data generated by the filter is small and is substantially independent of the size of the kernel, resulting in highly efficient use of conventional memory architectures. Gaussian approximations equivalent to those resulting from cascaded uniform filters can be produced, but at a computational cost that is lower when the memory access cost is properly accounted for.

Other advantages and features will become apparent from the following descriptions, and from the claims.

BRIEF DESCRIPTION OF THE DRAWING

The invention will be more fully understood from the following detailed description, in conjunction with the accompanying figures, wherein.

DESCRIPTION OF THE PREFERRED EMBODIMENTS

Figure 1:
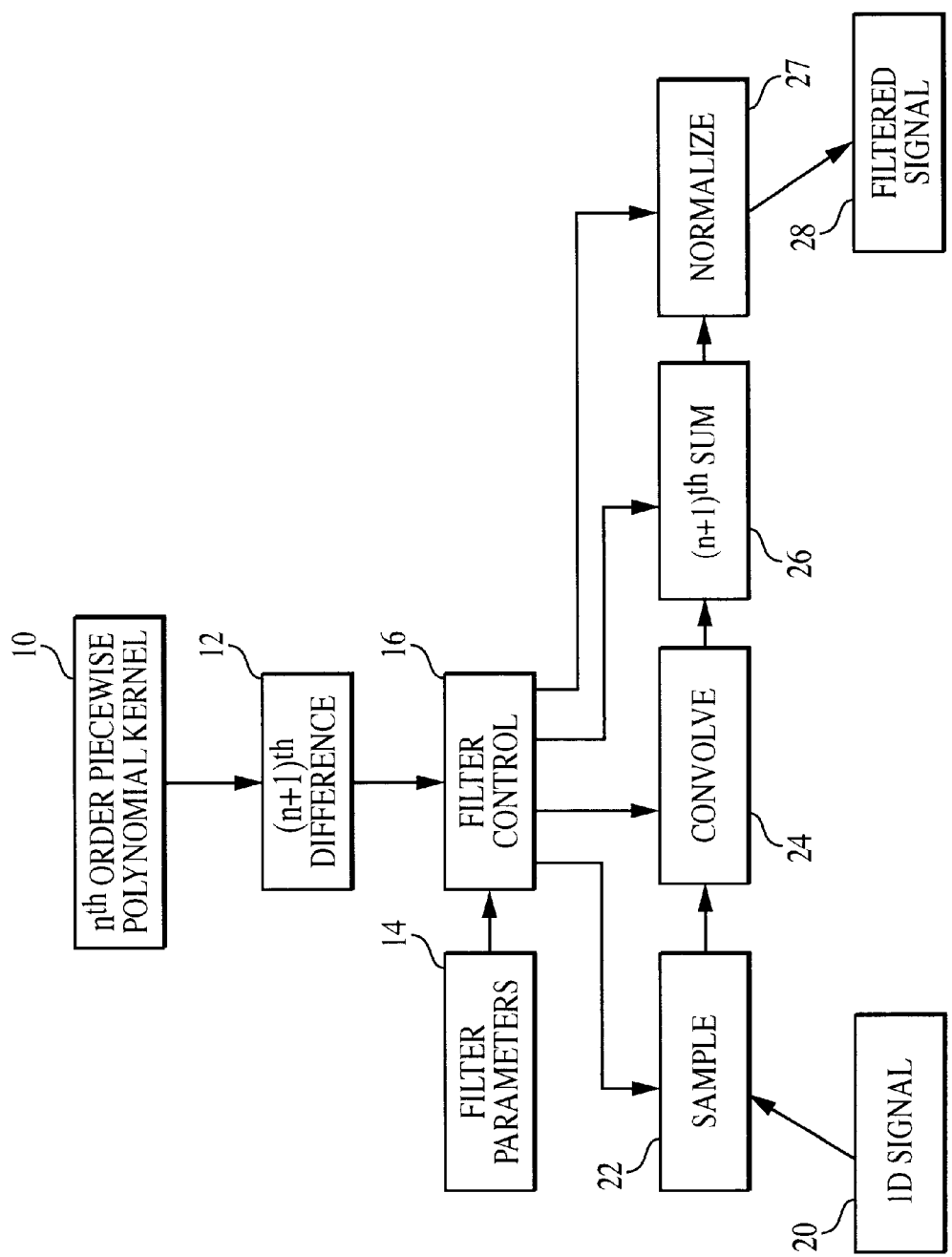
FIG. 1 is a block diagram of a preferred embodiment of the invention.

As recognized by the invention, any discrete function can be approximated to a desired precision by dividing the discrete function into pieces, and substituting for each piece a discrete polynomial having an order equal to or less than a preselected value 'n'. The resulting approximation is referred to as an "$n^{th}$ order piecewise polynomial". Referring to FIG. 1, the $(n+1)^{th}$ difference 12 of an $n^{th}$ order piecewise polynomial kernel 10 is used. Guidelines for and examples of the construction of the piecewise polynomial kernel are given below.

It can be shown that the $(n+1)^{th}$ difference of an $n^{th}$ order piecewise polynomial is zero everywhere, except where the pieces join. Here, a "difference" is the discrete version of a derivative. Thus, the $(n+1)^{th}$ difference 12 is zero everywhere except at the boundaries where the pieces join. At each such boundary there are one or more non-zero elements in the $(n+1)^{th}$ difference, as discussed below.

A filter control element 16 uses the $(n+1)^{th}$ difference 12 to provide a sampler 22 with information about the relative positions of the non-zero elements of the $(n+1)^{th}$ difference 12, to provide a convolver 24 with the values of the non-zero elements, to provide a summing element 26 (e.g., cascaded accumulators 29 of FIG. 3) with the order n of the filter, and to provide a normalizer 27 with information about the total weight of the kernel. Note that the sampler 22 provides a significant performance benefit, since it enables convolution to be performed using only the non-zero elements of the 1D digital signal 20.

A sequence of positions within a 1D digital signal 20 is designated for filtering, as discussed further below. For each such position, the sampler 22 samples values of elements of the 1D digital signal 20 at relative positions as specified by the filter control element 16, and passes these values to the convolver 24, which computes a weighted sum of the sampled signal elements using the non-zero $(n+1)^{th}$ difference elements from the filter control 16 as weights. The convolver thus produces a sequence of weighted sums corresponding to the sequence of positions within the 1D digital signal.

The sequence of weighted sums is provided to the summing element 26 that contains (n+1) cascaded accumulators 29. The output of the summing element 26 is a sequence of values that is the $(n+1)^{th}$ sum, i.e., the $(n+1)^{th}$ discrete integration, of the convolution of the original 1D signal 20 with the $(n+1)^{th}$ difference of the original kernel 10. As recognized by the invention, convolution by any discrete function is equivalent to convolution by the kth difference of the discrete function, followed by 'k' successive summations. Here, a "summation" is the discrete version of an integration. Thus, the output of the summing element 26 is equal to the convolution of the original signal with the original kernel.

The sequence of values output from the summing element 26 may be adjusted in magnitude by normalizer 27. In some embodiments, the normalizer is not used, which leaves the sequence of values unadjusted. In other embodiments the normalizer effectively divides each value of the sequence by the total weight of the kernel as indicated by the filter control 16 to produce a sequence of weighted averages. In still other embodiments, the normalizer multiplies or divides the elements of the sequence by other appropriate constants. The output of the normalizer is the filtered signal 28.

As described thus far, the method results in a fixed filter, i.e., a filter corresponding to one specific kernel and having a fixed response to its input. The method also applies to an adjustable filter, i.e., a filter that uses one or more filter parameters 14 to select from among a family of piecewise polynomial kernels. As shown in FIG. 1, these filter parameters 14 are read by the filter control 16 and used to generate necessary information for the sampler 22, convolver 24, summing element 26, and normalizer 27.

In a preferred embodiment, the filter parameters 14 include a single filter size parameter that selects from among a family of kernels that have the same order and number of pieces but vary by size. In this embodiment, the filter has a response that is adjustable over a wide range. In other embodiments, one or more filter parameters are used to change the number of pieces or the order of the kernel 10 or both. In a simple case, the filter size parameter changes the size of each piece of the polynomial equally, without changing the number, order, or basic shape of the pieces. This has the effect of changing the number of zero elements in the $(n+1)^{th}$ difference that fall between the non-zero elements that correspond to where the pieces join. Thus, the filter control 16 uses the filter size parameter 14 to determine the relative positions of the non-zero elements to be used by the sampler 22. Another effect is the change in the total weight of the kernel 10, which the filter control determines and provides to the normalizer 27.

In some cases, changing the spacing of the non-zero elements sufficiently adjusts the response of the filter. In other cases, the values of the non-zero elements that the filter control 16 provides to the convolver 24 are also changed. In general, the filter control uses the filter size parameter to adjust the spacing of the non-zero elements for the sampler, to adjust the values of the non-zero elements for the convolver, and to adjust the total weight for the normalizer.

Figure 2:
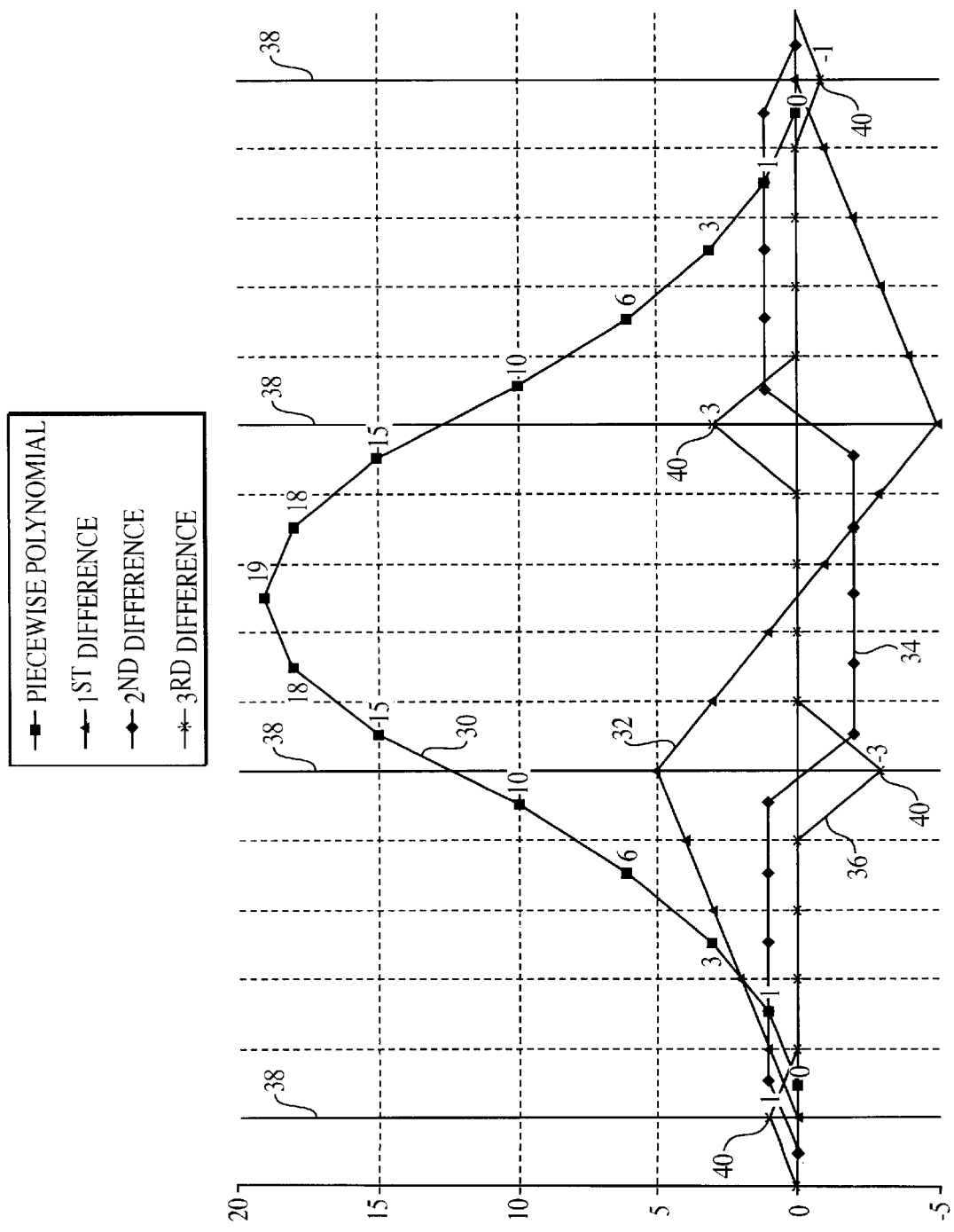
FIG. 2 is a plot of a second order piecewise polynomial approximation to a Gaussian low-pass filter kernel, and the first, second, and third differences thereof.

FIG. 2 shows an example of use of a fixed piecewise polynomial kernel 30 and its differences. The piecewise polynomial 30 approximates a Gaussian kernel and is used to provide a low-pass filter. Polynomial 30 provides a second order approximation by including three pieces, each being a portion of a parabola. The three pieces fall between the dividing lines 38, which indicate where the pieces join, including where the pieces join the regions of zero weight that extend indefinitely beyond the kernel. Kernel 30 has 13 non-zero elements having the weights shown.

Curve 32 represents the first difference of the kernel 30 and includes three first order pieces (straight lines). The curve 34 represents the second difference of the kernel 30 and includes three zero$^{th}$ order pieces, i.e., constant values. The curve 36 represents the third difference of the kernel 30 and is zero everywhere except for positions corresponding to the step-discontinuities in the second difference 34, which correspond to lines 38 where the pieces are joined. The four non-zero elements 40 of the third difference 36 have the values 1, −3, 3, and −1, and adjacent pairs of the elements 40 are separated by four zero elements.

In FIG. 2, for illustration purposes, each element of each difference is plotted at a horizontal position that is between the horizontal positions of the corresponding higher order curve. This positioning illustrates the relationship between the differences and how the differences relate at the boundaries 38. The curves 30, 32, 34, and 36 connecting the elements are drawn to aid in understanding the figure, but it should be understood that all of the signals, kernels, and differences consist solely of a sequence of discrete values. For example, the third difference includes the discrete values: 0, 1, 0, 0, 0, 0, −3, 0, 0, 0, 0, 3, 0, 0, 0, 0, −1, 0, and excludes all values between these listed discrete values.

Figure 3:
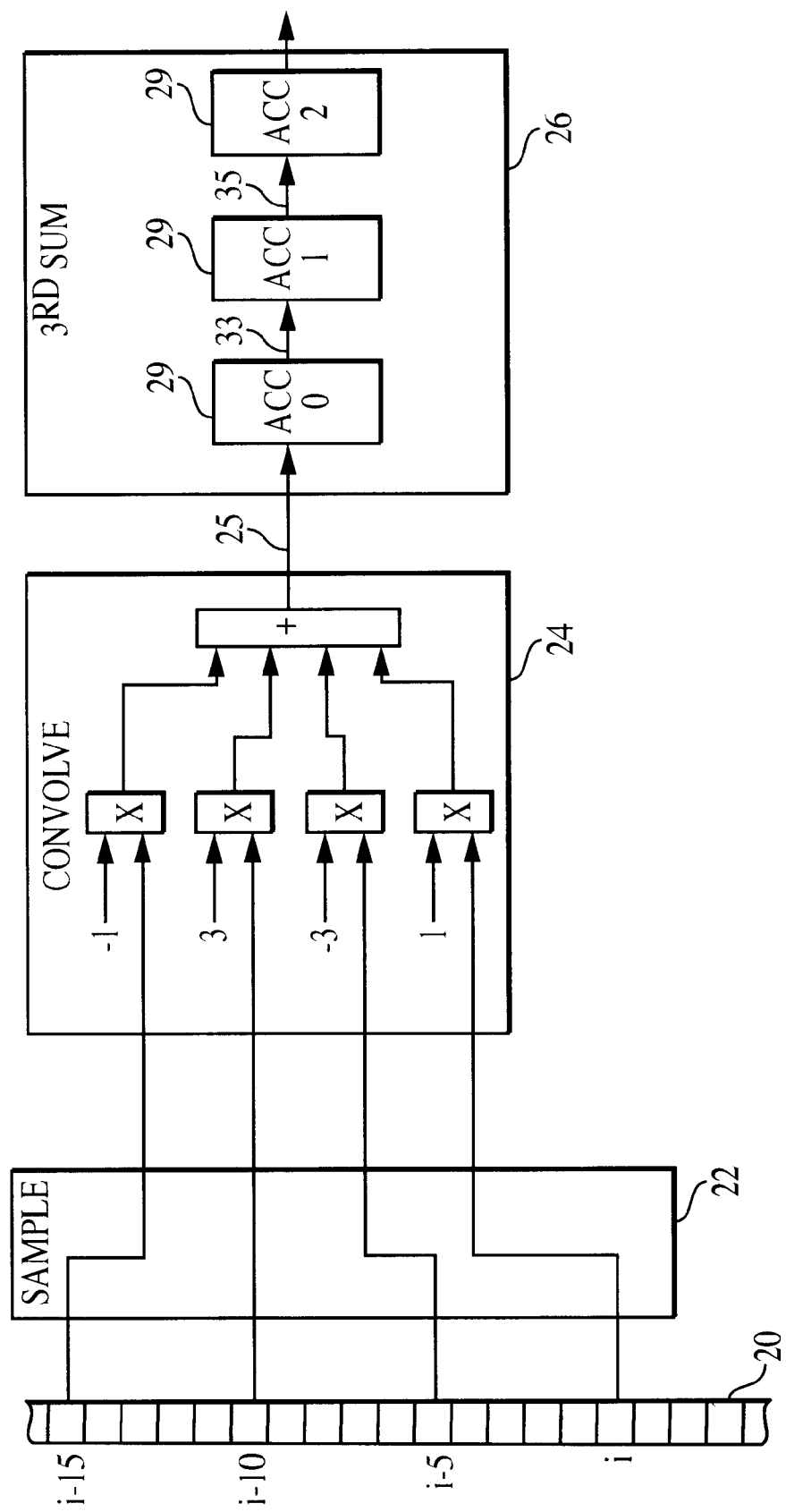
FIG. 3 is a schematic diagram of a filter based on the kernel of FIG. 2.

FIG. 3 shows the operation of the filter corresponding to FIG. 2. At each position 'i' of a sequence of positions of digital signal 20, the sampler 22 reads four values at relative positions i, i−5, i−10, and i−15. The convolver 24 multiplies these four values by the indicated four non-zero elements 40 of the third difference, and sums the resulting products to produce a weighted sum 25 for each of the positions of the signal 20. The sequence of weighted sums 25 so produced is discretely integrated three times by the accumulators 29 in the summing element 26. The normalization step described above is not shown.

Figure 3A:
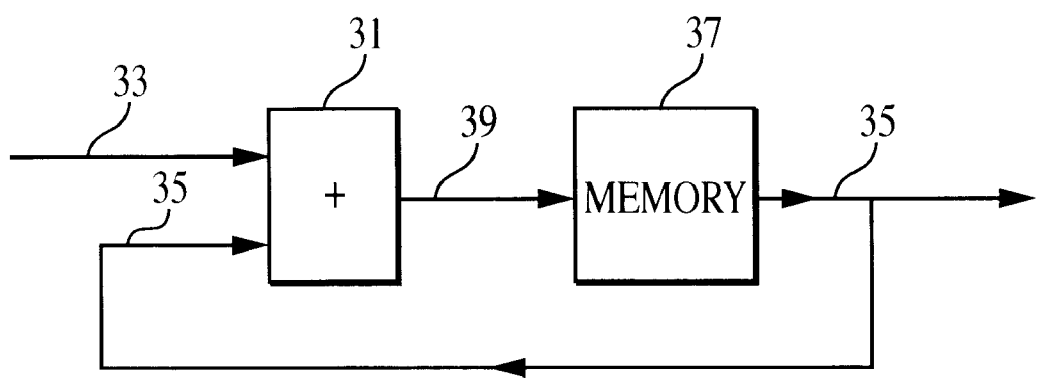
FIG. 3A shows an embodiment of an accumulator of FIG. 3.

FIG. 3A shows an embodiment of an accumulator 29. An adder 31 receives an input signal 33 and a memory feedback signal 35 from a memory 37, where the memory feedback signal is the result of the addition of the previous values of the input signals 33 and 35. The adder 31 provides an adder signal 39 that is the result of adding the two input signals 33 and 35. The resulting signal 35 is the discrete integration of the input signal 33.

Figure 4:
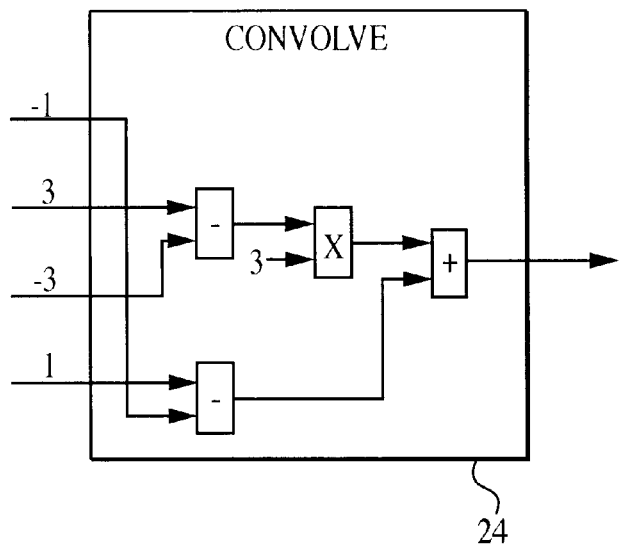
FIG. 4 is a schematic diagram of an embodiment of a convolve element according to the invention.

For the convolver 24, a variation suitable for the filter of FIG. 2 is shown in FIG. 4. In this case, the same results are produced with only one multiplication instead of four. Since this multiplication is by the fixed constant "3", it can be implemented by a single shift operation and a single addition operation if multiplication is computationally more expensive than addition for the particular processor used.

The filtered signal 28 produced is identical to that which would be produced by direct convolution of the signal with the original piecewise polynomial kernel 30. For each position of the signal, direct convolution would require at least thirty-six operations: fourteen memory accesses (including storing the filtered signal value in memory), eleven multiplication operations, and twelve addition operations. Note that this does not include normalization, which is optional. If the kernel elements are stored in SRAM instead of being permanently fixed in circuitry or software (i.e., instead of being "hardwired" or "hard-coded", respectively) that implements the convolver, direct convolution would require as many as fifty-three operations.

According to the invention, only twelve operations are required: five memory accesses, one multiplication operation, and six addition operations (here, subtraction has the same computational cost as addition). Since only three accumulator values are required, all of the accumulator values can be stored in a register file, access to which entails substantially no computational cost.

The filtered signal produced is identical to that which would be produced by the aforementioned method of cascaded uniform filters, where three such uniform filters of width "5" are used. With a cascade of three uniform filters, however, fifteen operations are required: two memory reading operations, two addition/subtract operations, and one memory writing operation for each of the three uniform filter steps. As discussed below, the performance advantage of the present invention is even more significant for two-dimensional filtering.

The usefulness of the low-pass filter of FIGS. 2–4 is enhanced if the response of the filter can be adjusted over a wide range. Regardless of how many zero elements separate the non-zero elements 40 of the third difference 36, as long as the number "s" of zero elements in each of the three pieces is the same, the basic shapes of the second difference 34, first difference 32, and the piecewise polynomial kernel 30 remain the same. The size, values, and total weight of the kernel vary, but the kernel maintains its approximately Gaussian shape.

The size of the corresponding kernel 30 is 3s+1 and the total weight of its elements is $(s+1)^3$. In the case where s=0, a kernel of one element (weight 1) results, and so the corresponding filter would have an output that is the same as its input.

Figure 5:
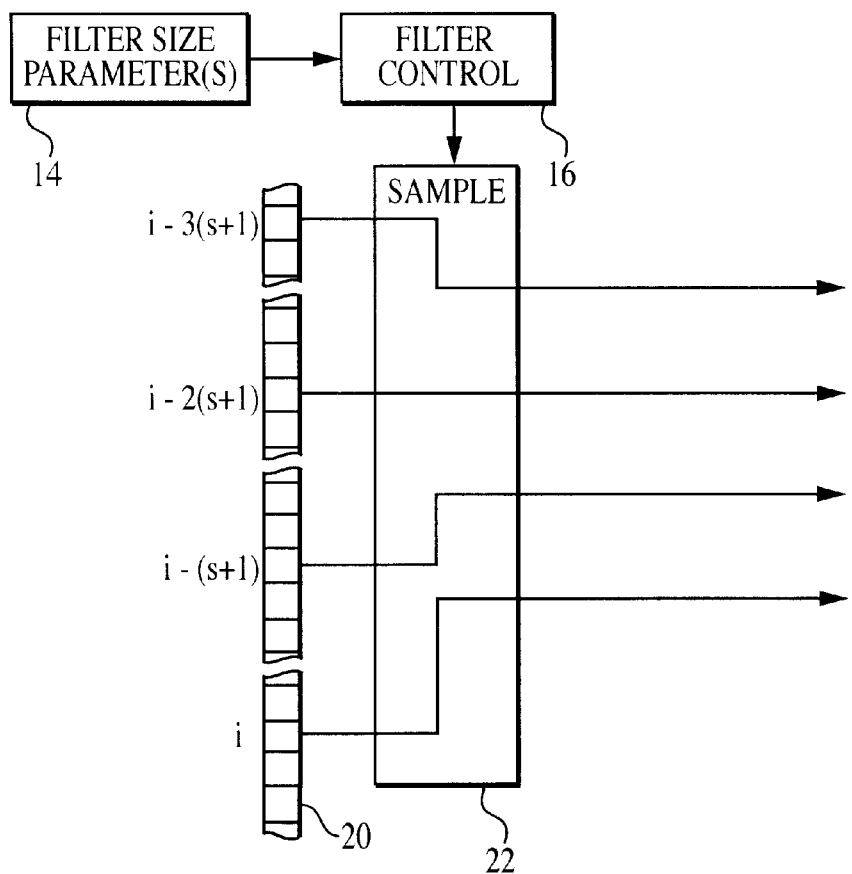
FIG. 5 is a schematic diagram of a portion of an adjustable version of the filter of FIG. 3.

FIG. 5 shows a portion of an adjustable variation of the filter of FIG. 3. In this case a filter size parameter 14 equal to the value "s" is used. The filter control 16 passes this value to the sampler 22, which uses value "s" to select the appropriate elements of the 1D signal 20. The convolver 24 of FIG. 3 or 4 and the summing element 26 of FIG. 3 are also used.

The filter modified as shown in FIG. 5 produces a piecewise second order Gaussian approximation that can be adjusted over a wide range, including a setting that produces an output signal that reflects no changes to the input signal. The number of operations required is independent of the value of the filter size parameter 14. The intermediate storage required by the filter is that sufficient to hold three values (corresponding to the three accumulators in the summing element) and is also independent of the filter size parameter.

Figure 6:
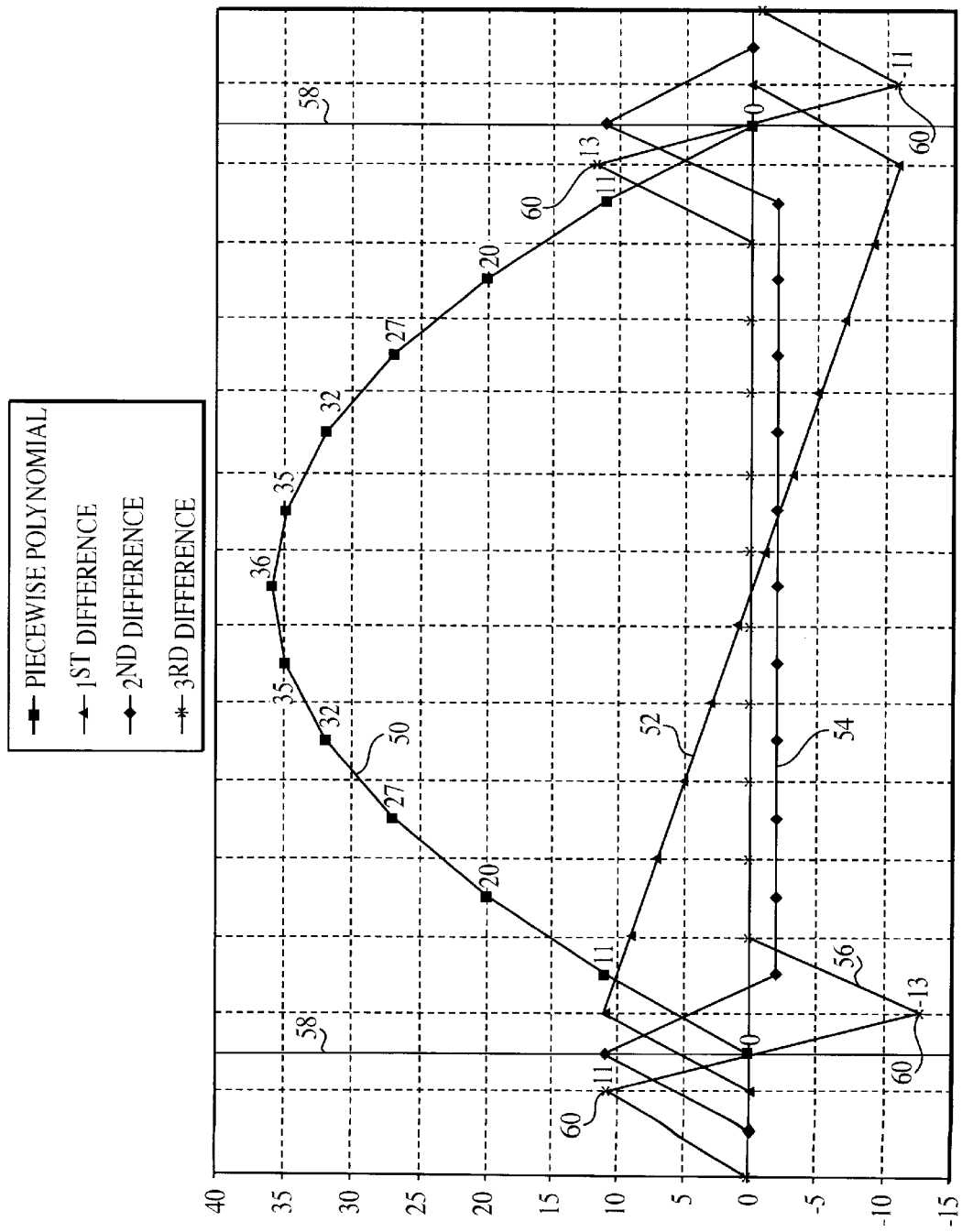
FIG. 6 is a plot of a second order single-piece polynomial parabolic low-pass filter kernel, and the first, second, and third differences thereof.

FIG. 6 shows another example of a fixed low-pass filter according to the invention. In this example, the piecewise polynomial kernel 50 includes one piece, which is a section of a parabola that joins the extending zero weight regions at boundaries 58. This section has eleven non-zero elements having values shown in FIG. 6. The first order first difference 52, zeroth order second difference 54, and third difference 56 are plotted in a manner similar to FIG. 2.

Unlike the first difference 32 of FIG. 2, the first difference 52 of FIG. 6 has step-discontinuities where it joins the extending zero weight regions at boundaries 58. These step-discontinuities result in impulses in the second difference 54 at the boundaries 58, superimposed on the constant piece of the second difference of a second order function. These impulses result in features called doublets in the third difference 56, superimposed on the impulses. The net result is that at each boundary 58 the third difference 56 has two non-zero elements 60 instead of one non-zero element as was the case for the arrangement shown in FIG. 2.

In an adjustable variation of the filter of FIG. 6, a filter size parameter 's' is used that is equal to the number of zero elements 's' separating the non-zero elements 60 of the third difference 56. The non-zero values of the third difference depend on. 's'; specifically, the values are (s+1), −(s+3), (s+3), and −(s+1). The size of the resulting kernel is s+1, and its total weight is given by the following expression:

$$(s+1)(s+2)(s+3)/6$$

Figure 7:
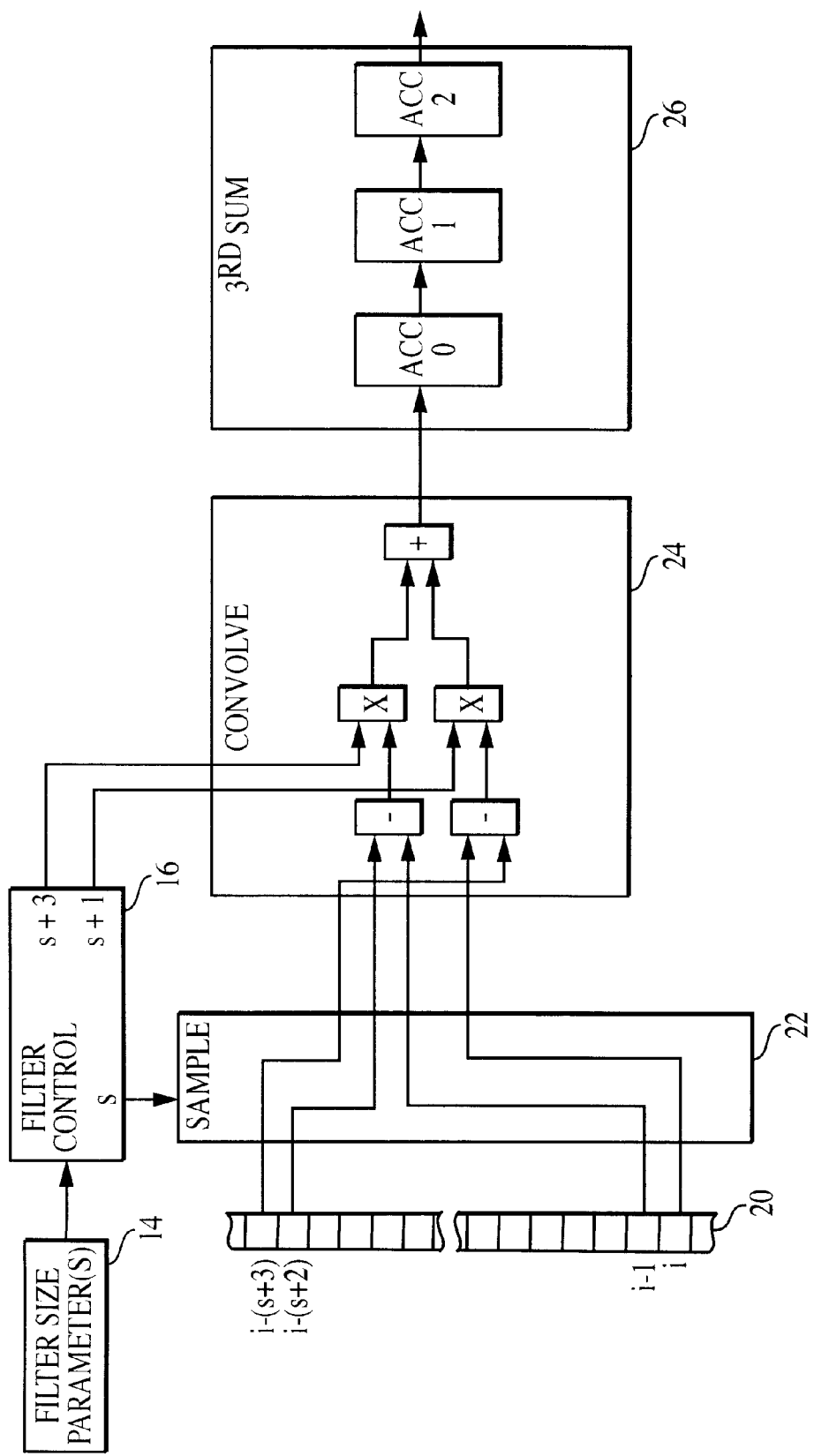
FIG. 7 is a schematic diagram of a filter based on the kernel of FIG. 6.

FIG. 7 shows an adjustable low-pass filter based on the second order kernel of FIG. 6. In this case the filter control 16 provides position information to the sampler 22 and -kernel values to the convolver 24, based on the filter size parameter 14. The convolver 24 requires an additional operation, specifically a multiplication operation, as compared to that of FIG. 4, but the sampler is made more efficient because two adjacent pairs of values of the signal 20 are accessed, rather than four separate values.

The filtering characteristics of an approximately parabolic low-pass filter are similar to those of an approximately Gaussian filter. Although the latter may have some theoretical advantages, in most practical applications the differences in filter response are not noticeable. The parabolic shape has some other practical advantages, however:

(1) The greater locality of reference of the adjacent pairs compared to four separate locations may result in computational savings, particularly for 2D filtering.

(2) The response of the parabolic filter is more finely adjustable, because each step of the filter size parameter changes the response of the parabolic filter by about half as much as in the case of the second order Gaussian, as measured by the standard deviation of the kernel.

(3) For approximately equivalent filter response, the parabolic kernel is smaller than the Gaussian approximation kernel. While this has no effect on computational cost, it means that the kernel can be placed in more positions along the 1D signal 20, which can reduce loss of signal or loss of fidelity near the ends of the signal.

Note that the parabolic kernel of FIG. 6 cannot be generated by the cascaded uniform filter method of Wells, this method producing only approximations to Gaussian filters. Of course, in addition to providing parabolic kernels and approximate Gaussian kernels, the invention can provide many other filter shapes, thereby allowing unprecedented flexibility in matching filter specifications to particular signal processing applications, in addition to unprecedented computational efficiency.

Figure 8:
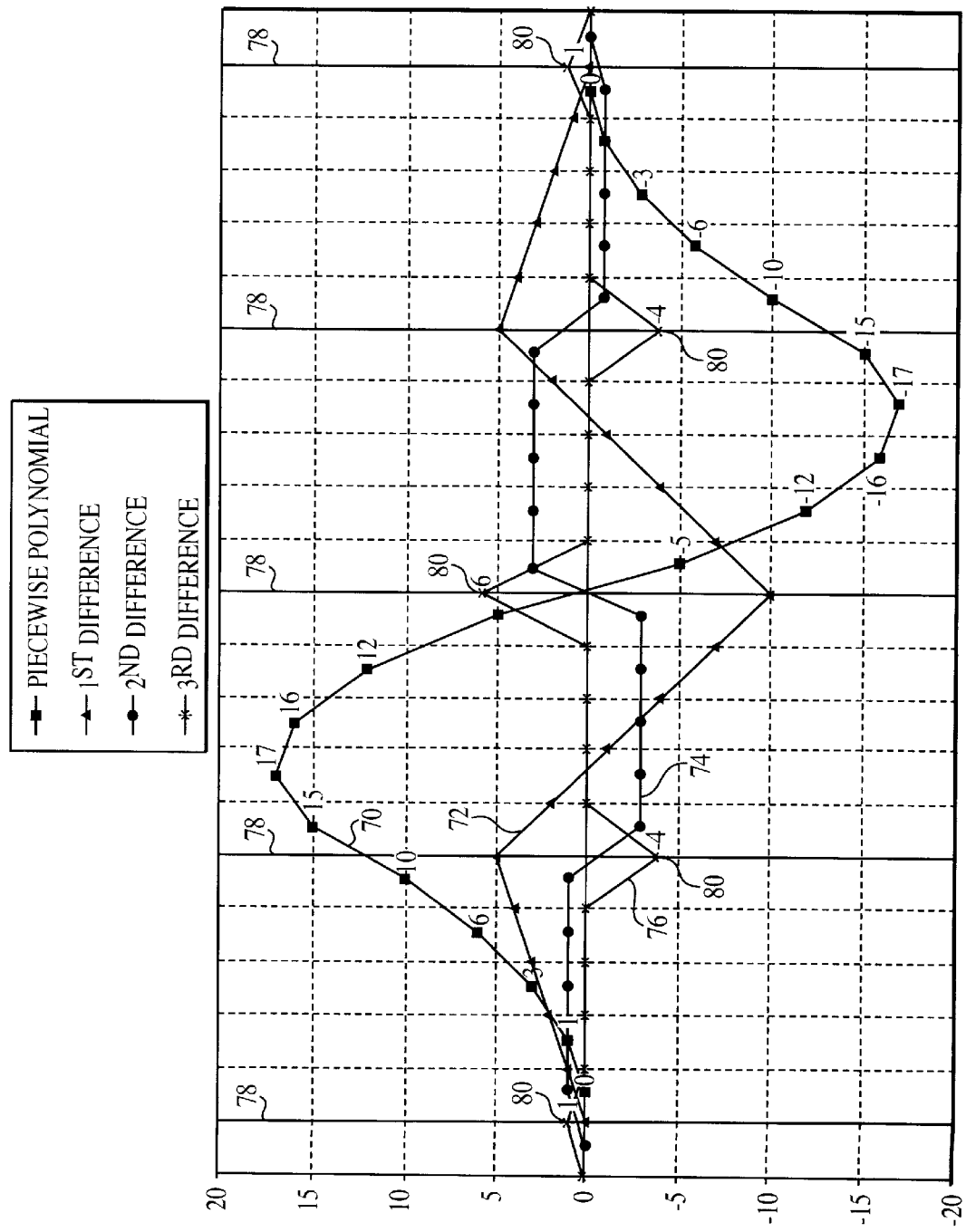
FIG. 8 is a plot of a second order piecewise polynomial band pass filter kernel, and the first, second, and third differences thereof.

Another example of a filter according to the invention is shown in FIG. 8, which discloses a band-pass filter. The piecewise polynomial kernel 70 is second order as before, but here there are four pieces joined at five boundaries 78. The first difference 72, second difference 74, and third difference 76 are plotted as before. The third difference has five non-zero elements 80 as shown.

This band-pass filter can be made adjustable by using a filter size parameter "s" to specify the number of zero elements separating the non-zero elements 80. In this case the values of the non-zero elements 80 are independent of "s". The adjustable filter may be implemented along the lines of FIGS. 3, 4, and 5.

Although the examples given above are of second order piecewise polynomial kernels, the method can be applied to piecewise polynomial kernels of any order, and any number of pieces. Furthermore, it is not necessary that each piece be of the same order. The order of the piecewise polynomial is defined to be the same as that of its highest-order piece.

In the above examples of adjustable filters, a filter size parameter is used to define a family of kernels of varying size but the same basic shape. It is also possible to use a parameter or set of parameters to define a family of kernels that vary in other ways, such as by order, number of pieces, or both.

For example, one can define a family of Gaussian approximations using two parameters: an order parameter "r" and a size parameter "s". Each member of the family is an (r+1)-piece r-order polynomial having a shape approaching that of a Gaussian as r increases. For example, the filter of FIG. 2 is a member of this family, where r=2. Each member of this family has (r+2) non-zero elements in the $(r+1)^{th}$ difference. The values of these non-zero elements are:

$$(-1)^{j}(r+1)!/j!(r+1-j)!$$

where $0<=j<=(r+1)$.

The number of zeros separating the non-zero elements is 's'. The size of the kernel is s(r+1)+1, its total weight is (s+1)(r+1), and its standard deviation is $$\sqrt{(r+1)s(s+2)/12}.$$

Also, (r+1) accumulators 29 are needed in the summing block 26. Filter control 16 operates according to these formulas to provide the information needed by the sampler 22, the convolver 24, the summing element 26, and the normalizer 27. Relative to the method of cascaded uniform filters, the computational cost savings increases as r increases, and are greater still for the 2D case.

Any piecewise polynomial can be used to practice this invention, and any desired precision can be achieved in approximating a desired kernel shape. In practice, because some arrangements work better than others, it is useful to have some general guidelines for these filters.

When specifying the parameters of the piecewise polynomial approximation 10, one objective is to minimize the computational cost of the filter, while at the same time achieve a reasonable approximation to some desired shape. In practical applications, because the exact shape of the kernel is usually less important than computational cost, it is useful to understand the characteristics of the piecewise polynomial that affect computational cost, i.e., the number of arithmetic and memory access operations that must be performed to generate each filter output value.

The number of operations is generally proportional to the sum of two terms: the number of non-zero elements in the $(n+1)^{th}$ difference 12, and the order of the piecewise polynomial 10.

As can be seen from the above examples, non-zero elements in the $(n+1)^{th}$ difference arise where the pieces of the polynomial join each other or join the regions of zero weights that extend beyond the kernel. In general, the number of non-zero elements at a particular boundary is (k+1), where k is the order of the highest-order difference that has a discontinuity at the given boundary. Thus it is desirable both to minimize the number of pieces and to avoid discontinuities in the higher-order differences.

These objectives may be at odds in some cases, because eliminating pieces may result in higher order discontinuities.

This was shown in the above examples, where the parabolic low-pass filter has two fewer pieces than the Gaussian filter, but has the same number of non-zero elements because discontinuities first appear in the first difference (first order) instead of the second difference (zero$^{th}$ order).

In some cases there may be so many pieces or so many discontinuities, or both, that the number of non-zero elements in the $(n+1)^{th}$ difference is not fewer than in the kernel itself. For example, any discrete kernel may be viewed as piecewise linear (first order) with one piece per element of the kernel. In such a case, it would be more expensive to use the method described above than to use direct convolution with the original kernel.

In general, increasing the order of the piecewise polynomial increases the number of operations both due to additional summation operations and due to memory accesses that are needed to read and write additional intermediate data. On the other hand, using higher order polynomials can sometimes reduce the number of pieces needed for an effective approximation. In practice, second order piecewise polynomials achieve a good balance between quality of the approximation to a desired shape and computational cost.

Another advantageous characteristic of the piecewise polynomial approximation of the invention is adjustability of the response of the filter over a wide range, as was true for each of the examples described above. Preferably, the adjustment does not require changing the number of pieces or introducing additional discontinuities. Thus, the computational cost associated with the filter is independent of its size, and simplifies the operation of the filter control, sampler, and convolver.

A preferable way to specify the parameters of an adjustable filter having pieces that fit without higher-order discontinuities is to work outward from a lower-order difference of the corresponding kernel instead of starting with the kernel itself. For example, a parabolic kernel as in FIG. 6 may be desired, but the kernel values to use and how to make the filter adjustable may not be known. The first difference should include a segment of a straight line, the slope of the line should be negative, the first difference should take on integer values, and the first difference should cross zero at the middle of the parabola. These guidelines restrict the options for the first difference, which leads to the filter shown. The parabolic kernel itself is obtained by summing the first difference; the particular values of the kernel are not all that important so long as the basic shape of the kernel, i.e., the relationships among the values, is as required by the particular application.

In each of the above examples the elements of the piecewise polynomial kernels and their differences have integer values, and therefore if the signal elements are also integers then the arithmetic operations connected with FIGS. 3, 4, and 7 can be implemented as integer operations. The methods described herein can also be used for floating point signal values, by using floating point arithmetic operations in the convolver 24, summing element 26, and normalizer 27. The methods can also be used with floating point values in the $(n+1)^{th}$ difference, but there are some important considerations.

For proper operation, the values used for the $(n+1)^{th}$ difference should be exact. Any errors that result from a floating point number's inability to represent the exact value accumulate as successive positions of the signal 20 are processed. Generally, the errors grow as the $(n+1)^{th}$ power of position along the signal, so that significant errors accumulate quickly. In many practical applications, due to a combination of the shortness of the signal and the precision of the floating point representation, this may not be a problem. Preferably, however, floating point values are used only where they can represent the desired $(n+1)^{th}$ difference values exactly. Note that floating point signal values can be used freely, since signal errors do not accumulate and since the signal values are usually estimates of some physical quantity.

The following example illustrates how floating point values arise during filter specification and how they are handled. Suppose an adjustable second order piecewise polynomial kernel is sought, and the first difference, a piecewise linear function, is selected as the starting place of the kernel specification. Preferably, to minimize non-zero elements in the third difference, the straight-line pieces of the first difference should join without discontinuities. This requires that one such piece span x units horizontally and y units vertically. If the slope y/x is not an integer, there are non-integral values in the first, second and third differences. If the non-integral values in the third difference can be represented exactly in floating point form, they can be used directly. If not, or if integer operations are used in the filter, then the entire piecewise linear function is multiplied by 'x', or other suitable value, to eliminate the non-integer values. Note that multiplying by x does not change the relative weights of the kernel elements, so the kernel shape is unaffected.

For a signal of length w and a kernel of size d there are (w−d+1) positions for the kernel within the signal, and the filter produces an output value for each of those positions. If preferred, the signal can be extended beyond the ends so that additional output values can be produced. In particular, it may be preferred to produce an output signal that is the same size as the input instead of being reduced in size by d−1. To minimize boundary effects, the signal can be extended by, for example, reflecting it about its endpoints.

For proper operation, the filters should be initialized before they begin producing output values. The initialization procedure is shown in FIG. 9. The length of the signal 20 is w, the size of the piecewise polynomial kernel 10 is d, and the size of the region containing all of the non-zero elements of the $(n+1)^{th}$ difference 12 is (d+n+1).

Figure 9A:
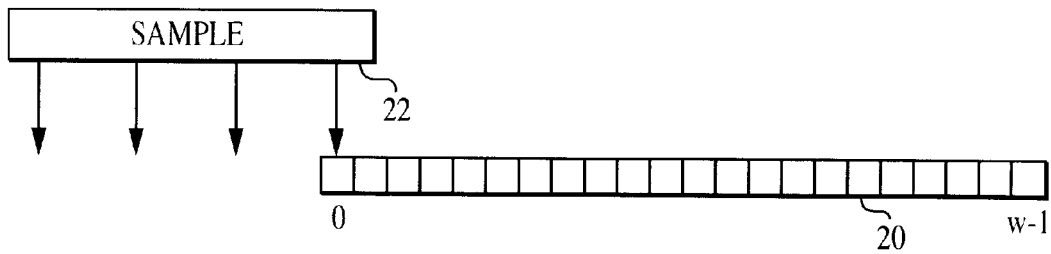
FIGS. 9A, 9B, and 9C are block diagrams showing initialization, and the first and last positions of a sampler that result in a valid output.

First, the accumulators 29 in the summing element 26 are set to zero. The sampler 22 starts at position i=0 as shown in FIG. 9a. In this position, the first non-zero element of the $(n+1)^{th}$ difference corresponds to the first signal element at position zero as shown. All of the other non-zero elements are at negative positions, i.e., before the beginning of the signal, and the sampler reads them as zero.

The sequence of positions in the range $0 \leq i < (w-1)$ are processed by the filter. The sampler reads any negative signal position (i.e., before the beginning of the signal) as zero. The positions in the range $0 \leq i < (d-1)$ represent the initialization sequence. For these positions, no output is produced by the filter, but sampling 22, convolution 24, and accumulation 26 steps are performed to initialize the accumulators 29.

Figure 9B:
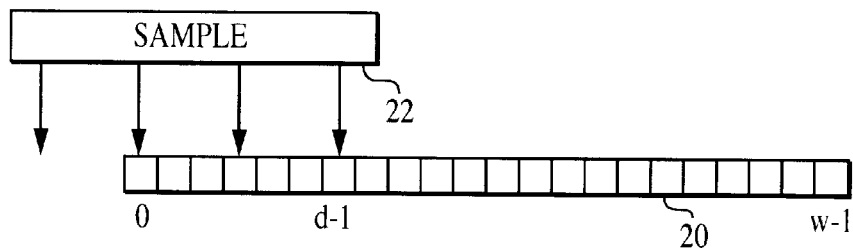
Figure 9C:
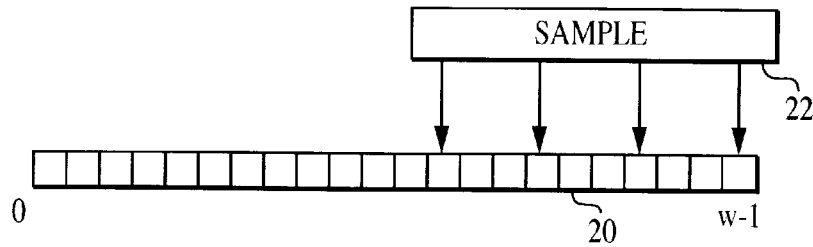

The first position that produces an output value is at i=d−1, as shown in FIG. 9b. In this position, one or more of the non-zero elements of the $(n+1)^{th}$ difference are at negative positions reading zero, as shown. The last position that produces an output value is at i=w−1, as shown in FIG. 9c. The (w−d+1) output values are produced as expected.

An important practical application is the filtering of multi-dimensional digital signals, particularly 2D signals such as images. The procedures and methods described above provide significant benefits in such applications by providing efficient, flexible digital filters. The procedures and methods can be used whenever separable multi-dimensional kernels are used for filtering. A separable n-dimensional kernel is a filter that can be factored into a product of n kernels corresponding to the n dimensions, each of which is a function of only the corresponding dimension. Many kernels commonly used for low-pass, band-pass, and high-pass filtering, and for operations such as edge detection, are separable.

For each of the factors of a separable kernel, a 1D kernel called a projection is constructed with the values along the factor's corresponding dimension. Convolution with a separable n-dimensional kernel is equivalent to successive convolution by each of the n projections. Each of these convolutions is effectively a convolution along one dimension of the signal by a 1D kernel, which allows use of the procedures and methods described herein.

The numerical result is independent of the order of the convolutions. The efficiency of the filter may depend on the order chosen and also on how the procedures and methods described herein are used. Optimum performance depends on the pattern of memory accesses used to process the signal.

Figure 10:
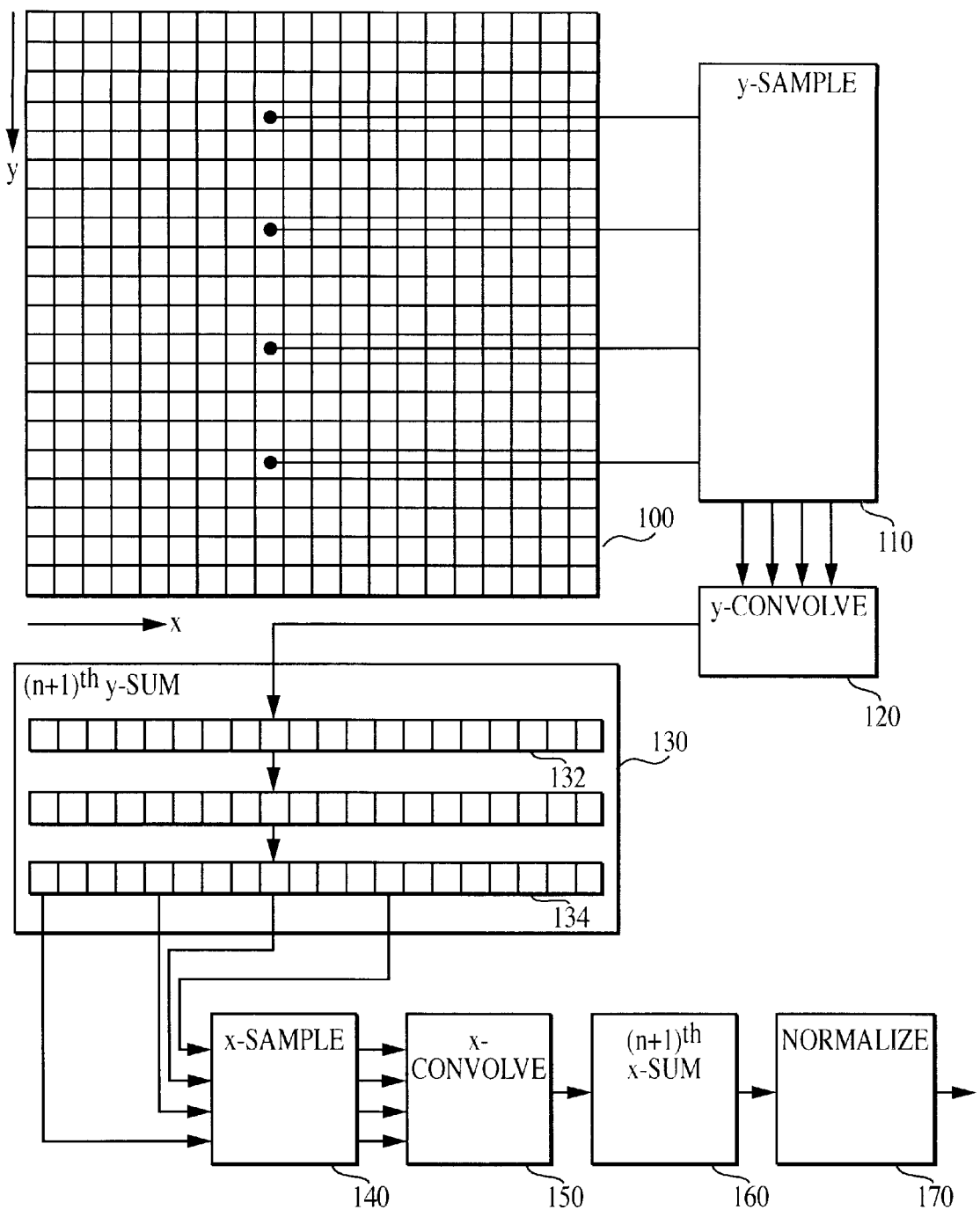
FIG. 10 is a block diagram of a preferred embodiment two-dimensional filter according to the invention.

FIG. 10 shows a preferred embodiment of a 2D filter selected for use with a memory system containing a large DRAM (or an equivalent such as SDRAM or RAMBUS) memory, a smaller SRAM memory such as a data cache, and a small register file. A two-dimensional signal 100, such as an image with x and y dimensions as shown, is stored in the DRAM. As noted above, such a memory allows accessing elements at sequential addresses much faster than at non-sequential addresses. The elements along the x dimension are considered to be at sequential addresses. Sequences of elements along the x and y dimensions are called rows and columns, respectively.

To minimize the quantity of intermediate data that is stored so that it fits in available SRAM, the x and y filter steps are intermingled. Successive complete rows of y-filtered data are produced one at a time. Each such row produced is immediately x-filtered, resulting in one row of xy-filtered data. Preferably, the rows of y-filtered data are not normalized, both to save computation time and to avoid loss of precision. The xy-filtered data is normalized based on the total weight of the full 2D kernel and is stored in the DRAM memory to form the filter output.

With reference again to FIG. 10, a new row of y-filtered data corresponding to position y=j is produced as follows. A y-sampler 110 reads elements of signal 100 at sequential x positions from rows at y positions relative to j that correspond to the relative positions of the non-zero elements of the $(n_y+1)^{th}$ difference of the 2D kernel's y projection. A weighted sum of each such set of elements is computed by a y-convolver 120, using the $(n_y+1)^{th}$ difference elements as weights. Also, $(n_y+1)$ rows of accumulators 130 are used, and are preferably stored in SRAM. Each value from the y-convolver 120 is added to the accumulator of the first row of accumulators 132 that corresponds to the x position from which the signal values were read by the y-sampler 110. The result of this sum is added to the corresponding accumulator of the second row, and corresponding additions are executed up to the $(n_y+1)^{th}$ row 134. The sampling, convolving, and summing operations are repeated for all x positions for one set of y positions in the signal 100. The result in the $(n_y+1)^{th}$ row of accumulators 134 is the y-filtered data at position y=j. Note that since data is read from the signal 100 sequentially in x, the access cost is small.

Each row of y-filtered data is x-filtered. An x-sampler 140 reads elements from the $(n_y+1)^{th}$ row of accumulators 134 at relative positions that correspond to the relative positions of the non-zero elements of the $(n_x+1)^{th}$ difference of the 2D kernel's x projection. A weighted sum of each such set of elements is computed by a x-convolver 150, using the $(n_x+1)^{th}$ difference elements as weights. The sequence of weighted sums produced by the x-convolver is summed $(n_x+1)$ times by summing element 160, normalized by element 170, and stored in the DRAM memory (not shown).

Note that the initialization steps of FIG. 9 apply independently in both dimensions. Filter parameters and filter control elements are not shown but are identical to the 1D cases.

The intermediate storage required by the 2D filter of FIG. 10 consists of the rows of accumulators in the y-summing block 130 and the accumulators in the x-summing block 160. As in the 1D case, since the storage required for the x-summing block is small and is independent of the kernel size, a zero-cost register file can be used. The storage required for the y-summing block is proportional to the order of the kernel's y projection and to the width of the signal 100, but is also independent of the kernel size. This independence of kernel size is an important and advantageous property. For example, independence of kernel size allows the intermediate storage to be held in a small SRAM memory, which has a significant beneficial effect on the performance of the filter.

The 2D filter of FIG. 10 can be generalized to any number of dimensions.

With a low-pass filter, it may be useful to obtain every $m^{th}$ filtered value instead of every value. This is called sub-sampling by m, and can be done independently in each dimension for a multi-dimensional filter. For the 1D case sub-sampling allows the normalization step to be skipped for filter values to be discarded. For the 2D case according to the embodiment of FIG. 10, substantial savings are possible, because the entire x-filtering step can be eliminated for all rows to be discarded in the y dimension.

Dedicated hardware may be used for all of the elements of the filter of the invention. In such a case, dedicated memory holds the signals, accumulators and filter parameters, dedicated arithmetic elements provide the convolver, summing element, and normalizing element, and dedicated control circuits provide the filter control and sampler. Alternatively, the arithmetic and control elements may be implemented by a field programmable gate array or similar device, so that a variety of filters can be obtained from a single circuit.

Alternatively, the filter of the invention may be implemented by a programmable digital signal processor ("DSP") or general purpose computer. In these forms, the DSP or computer's general purpose memory is used to hold the signals. On devices that have programmer-controlled SRAM, such as the TI TMS320C80 DSP, the accumulator rows 130 for 2D filter can be held in the SRAM. A 2D signal may be processed in vertical strips if it is too wide for all of the accumulators to fit at once. On devices that have conventional data caches, such as the Intel Pentium1 MMX, the processor automatically keeps as much of the rows of accumulators in cache as will fit, depending on competition with other necessary data. The accumulators for 1D filtering, or 2D x-filtering, may be held in general purpose CPU registers.

For DSP or general purpose computer implementations, the sampling, filter control, and arithmetic operations are performed by appropriate software. Guidelines for making optimum use of a particular DSP or computer are provided by the manufacturer.

For any of the embodiments described above, the normalization element is preferably implemented by multiplying by the reciprocal of the total kernel weight rather than dividing by the total weight, since division operations are generally much more computationally expensive. For integer processors, an integer multiplication operation followed by a shift may be used. The filter control element may calculate the appropriate multiplier and shift count corresponding to the reciprocal of the total kernel weight.

For low-pass filters, it may be useful to produce a filtered signal to a higher precision than the input signal, since the weighted average tends to reduce signal noise. In such a case, the filter control element can provide a more appropriate constant to the normalization element.

Other modifications and implementations will occur to those skilled in the art without departing from the spirit and the scope of the invention as claimed. Accordingly, the above description is not intended to limit the invention except as indicated in the following claims.

What is claimed is:

1. A method for digitally processing a one-dimensional signal, the method comprising:

convolving the one-dimensional signal with a function that is the $(n+1)^{th}$ difference of an $n^{th}$ order discrete piecewise polynomial kernel so as to provide a second one-dimensional digital signal, 'n' being at least 2, the polynomial kernel having at least one non-linear piece, and the function having fewer non-zero elements than the polynomial kernel has non-zero elements; and performing discrete integration n+1 times on the second one-dimensional digital signal to produce a processed signal.

2. The method of claim 1, where convolving includes performing computations that involve only the non-zero elements of the function.

3. The method of claim 1, wherein the $n^{th}$ order discrete piecewise polynomial kernel is a low-pass filter comprising n+1 pieces.

4. The method of claim 1, wherein the function includes n+2 non-zero elements, the non-zero elements being proportional to $[(-1)^j(n+1)!]/[j!(n+1-j)!]$ for integral values of 'j' between 0 and n+1 inclusive, and the non-zero elements of the function being separated by 's' zeros, where 's' is greater than 0.

5. The method of claim 4, wherein n=2, and the function includes four non-zero elements, the four non-zero elements being proportional to 1, −3, 3, and −1, respectively.

6. The method of claim 1, wherein the $n^{th}$ order discrete piecewise polynomial kernel is a low-pass filter including no more than one piece.

7. The method of claim 6, wherein n=2;

the function includes first, second, third, and fourth non-zero elements, the non-zero elements being proportional to (s+1), −(s+3), (s+3), and −(s+1) respectively, where 's' is an integer greater than zero; and the function includes 's' zero elements between the second non-zero element and the third non-zero element.

8. The method of claim 1, wherein the $n^{th}$ order discrete piecewise polynomial kernal is a band-pass filter including n+2 pieces.

9. The method of claim 8, wherein n=2;

the function includes five non-zero elements proportional to 1, −4, 6, −4, and 1 respectively; and the non-zero elements of the function are separated by 's' zero elements, where 's' is greater than 0.

10. A method for digitally processing a one-dimensional signal so as to provide for adjustment over a range of performance characteristics, the method comprising:

providing a family of related one-dimensional discrete piecewise polynomial convolution kernels, wherein the convolution kernels are specified by at least one selectable parameter, wherein a plurality of the convolution kernels are at least $2^{nd}$ order piecewise polynomials, and wherein for a plurality of convolution kernels, each has more non-zero elements than its $(n+1)^{th}$ difference, where 'n' is the order of the convolution kernel;

selecting, based on desired performance characteristics, said at least one selectable parameter, thereby selecting a convolution kernel determined by said at least one selectable parameter, the convolution kernel being of order n;

convolving the digital one-dimensional signal with a function that is the $(n+1)^{th}$ difference of the convolution kernel so as to provide a second one-dimensional digital signal; and performing discrete integration n+1 times on the second one-dimensional digital signal to produce a processed signal.

11. The method of claim 10, wherein a selectable parameter determines the size of the convolution kernel.

12. The method of claim 10, wherein a selectable parameter determines the order 'n' of the convolution kernel.

13. The method of claim 10, wherein a selectable parameter determines the number of pieces of the convolution kernel.

14. The method of claim 10, additionally comprising:

using the at least one selectable parameter to determine a normalization value; and using the normalization value to adjust the magnitude of the processed signal.

15. The method of claim 14, wherein the normalization value is proportional to the total weight of the selected convolution kernel.

16. The method of claim 10, wherein the family of related one-dimensional discrete piecewise polynomial convolution kernels are low-pass filters including n+1 pieces.

17. The method of claim 16, wherein the function includes n+2 non-zero elements, the n+2 non-zero elements being proportional to $[(-1)^j(n+1)!]/[j!(n+1-j)!]$ for integral values of 'j' between 0 and n+1 inclusive, and the non-zero elements of the function being separated by 's' zero elements, where 's' is at least 0.

18. The method of claim 17, wherein 's' is a selectable parameter.

19. The method of claim 18, wherein n=2, and the function includes four non-zero elements, the four non-zero elements being proportional to 1, −3, 3, and −1, respectively.

20. The method of claim 17, wherein 'n' is a selectable parameter.

21. The method of claim 10, wherein the family of related one-dimensional discrete piecewise polynomial convolution kernels are low-pass filters including no more than one piece.

22. The method of claim 21, wherein n=2;

's' is a selectable parameter, wherein 's' is an integer at least equal to zero;

the function includes first, second, third, and fourth non-zero elements, the non-zero elements being proportional to (s+1), −(s+3), (s+3), and −(s+1) respectively; and the function includes 's' zero elements between the second non-zero element and the third non-zero element.

23. The method of claim 10, wherein the family of related one-dimensional discrete piecewise polynomial convolution kernels are band-pass filters including n+2 pieces.

24. The method of claim 23, wherein n =2;

's' is a selectable parameter, where 's' is an integer equal to at least zero;

the function includes five non-zero elements proportional to 1, −4, 6, −4, and 1 respectively; and the non-zero elements of the function are separated by 's' zero elements.

25. A method for digitally processing a multi-dimensional signal, the method comprising:

for at least one dimension of the multi-dimensional signal, convolving the multi-dimensional signal along the dimension with a one-dimensional function that is the $(n+_1)^{th}$ difference of an $n^{th}$ order discrete piecewise polynomial kernel so as to provide a second multi-dimensional digital signal, 'n' being at least 2, each polynomial kernel having at least one non-linear piece, each function having fewer non-zero elements than the corresponding polynomial kernel has non-zero elements; and for each convolved dimension, discretely integrating the second multidimensional digital signal n+1 times along the convolved dimension to produce a processed multi-dimensional signal, where 'n' is the order of the polynomial kernel corresponding to the convolved dimension.

26. The method of claim 25, where convolving includes performing computations that involve only non-zero elements of the corresponding function.

27. A method for digitally processing a multi-dimensional signal so as to provide for adjustment over a range of performance characteristics, the method comprising:

for at least one dimension of the multi-dimensional signal, providing a corresponding family of related one-dimensional discrete piecewise polynomial convolution kernels, the convolution kernels being specified by at least one selectable parameter, a plurality of the convolution kernels being at least $2^{nd}$ order piecewise polynomials, and for a plurality of convolution kernels, each convolution kernel having more non-zero elements than its $(n+1)^{th}$ difference, where 'n' is the order of the convolution kernel;

for each family, selecting said at least one selectable parameter based on desired performance characteristics, thereby selecting a convolution kernel determined by said at least one selectable parameter, the convolution kernel being of order 'n';

for each family, convolving the digital multi-dimensional signal along a corresponding dimension with a function that is the $(n+1)^{th}$ difference of the convolution kernel so as to provide a second multi-dimensional digital signal; and for each family, performing discrete integration n+1 times along the corresponding dimension of the second multi-dimensional digital signal to produce a processed signal.

28. The method of claim 27, wherein a selectable parameter specifies the size of at least one convolution kernel.

29. The method of claim 27, wherein a selectable parameter determines the order 'n' of at least one convolution kernel.

30. The method of claim 27, wherein a selectable parameter determines the number of pieces of at least one convolution kernel.

31. The method of claim 27, additionally comprising:

using the at least one selectable parameter of at least one family to determine a normalization value; and using the normalization value to adjust the magnitude of the processed signal.

32. The method of claim 31, wherein the normalization value is proportional to the total combined weight of all of the selected convolution kernels.

33. A method for processing a digital image comprising rows and columns of data, the method comprising:

storing the digital image in a first memory;

providing (n+1) rows of column accumulators stored in a second memory;

providing (m+1) row accumulators stored in a third memory;

processing the digital image in a sequence of row coordinates;

for each row coordinate, selecting a fixed number of rows at fixed offsets from the row coordinate;

processing the selected rows in a sequence of column coordinates;

for each column coordinate, fetching from the first memory data stored at the column coordinate of each selected row;

multiplying data fetched from the first memory by corresponding coefficients and summing resulting products to produce a sequence of column values corresponding to the sequence of column coordinates, said coefficients being the non-zero elements of a function that is the $(n+1)^{th}$ difference of an $n^{th}$ order discrete piecewise polynomial kernel, 'n' being at least 2, the polynomial kernel having at least one non-linear piece, and where the function has fewer non-zero elements than the polynomial kernel has non-zero elements;

using the (n+1) rows of column accumulators to integrate the sequence of column values (n+1) times;

for each row coordinate, convolving the $(n+1)^{th}$ column accumulator with a function that is the $(m+1)^{th}$ difference of an $m^{th}$ order discrete piecewise polynomial kernel so as to provide a one-dimensional signal, 'm' being at least 2, the polynomial kernel having at least one non-linear piece, the function having fewer non-zero elements than the polynomial kernel has non-zero elements; and using the (m+1) row accumulators to integrate the one-dimensional signal (m+1) times to produce a processed image.

34. The method of claim 33, wherein the first memory provides sequential data access that is of higher speed than non-sequential access.

35. The method of claim 33, wherein the second memory provides sequential data access that is substantially as fast as non-sequential data access.

36. The method of claim 33, wherein the third memory provides data access at substantially zero access time cost.

37. Computer software, residing on a computer-readable storage medium, including instructions for use in a computer system to digitally process a one-dimensional signal, the instructions for causing:

convolving the one-dimensional signal with a function that is the $(n+1)^{th}$ difference of an $n^{th}$ order discrete piecewise polynomial kernel so as to provide a second one-dimensional digital signal, 'n' being at least 2, the polynomial kernel having at least one non-linear piece, and the function having fewer non-zero elements than the polynomial kernel has non-zero elements; and performing discrete integration n+1 times on the second one-dimensional digital signal to produce a processed signal.

38. The computer software of claim 37, where convolving includes performing computations that involve only the non-zero elements of the function.

39. The computer software of claim 37, wherein the $n^{th}$ order discrete piecewise polynomial kernel is a low-pass filter comprising n+1 pieces.

40. The computer software of claim 39, wherein the function includes n+2 non-zero elements, the non-zero elements being proportional to $[(-1)^j(n+1)!]/[j!(n+1-j)!]$ for integral values of 'j' between 0 and n+1 inclusive, and the non-zero elements of the function being separated by 's' zeros, where 's' is greater than 0.

41. The computer software of claim 40, wherein n=2, and the function includes four non-zero elements, the four non-zero elements being proportional to 1, −3, 3, and −1, respectively.

42. The computer software of claim 37, wherein the $n^{th}$ order discrete piecewise polynomial kernel is a low-pass filter including no more than one piece.

43. The computer software of claim 42, wherein n=2;

the function includes first, second, third, and fourth non-zero elements, the non-zero elements being proportional to (s+1), −(s+3), (s+3), and −(s+1) respectively, where 's' is an integer greater than zero; and the function includes 's' zero elements between the second non-zero element and the third non-zero element.

44. The computer software of claim 37, wherein the $n^{th}$ order discrete piecewise polynomial kernel is a band-pass filter including n+2 pieces.

45. The computer software of claim 44, wherein n =2;

the function includes five non-zero elements proportional to 1, −4, 6, 4, and 1 respectively; and the non-zero elements of the function are separated by 's' zero elements, where 's' is greater than 0.

46. Computer software, residing on a computer-readable storage medium, including instructions for use in a computer system to digitally process a one-dimensional signal so as to provide for adjustment over a range of performance characteristics, the instructions for causing:

providing a family of related one-dimensional discrete piecewise polynomial convolution kernels, wherein the convolution kernels are specified by at least one selectable parameter, wherein a plurality of the convolution kernels are at least $2^{nd}$ order piecewise polynomials, and wherein for a plurality of convolution kernels, each has more non-zero elements than its $(n+1)^{th}$ difference, where 'n' is the order of the convolution kernel;

selecting, based on desired performance characteristics, said at least one selectable parameter, thereby selecting a convolution kernel determined by said at least one selectable parameter, the convolution kernel being of order n;

convolving the digital one-dimensional signal with a function that is the $(n+1)^{th}$ difference of the convolution kernel so as to provide a second one-dimensional digital signal; and performing discrete integration n+1 times on the second one-dimensional digital signal to produce a processed signal.

47. The computer software of claim 46, wherein a selectable parameter determines the size of the convolution kernel.

48. The computer software of claim 46, wherein a selectable parameter determines the order 'n' of the convolution kernel.

49. The computer software of claim 46, wherein a selectable parameter determines the number of pieces of the convolution kernel.

50. The computer software of claim 46, the instructions also for causing:

using the at least one selectable parameter to determine a normalization value; and using the normalization value to adjust the magnitude of the processed signal.

51. The computer software of claim 50, wherein the normalization value is proportional to the total weight of the selected convolution kernel.

52. The computer software of claim 46, wherein the family of related one-dimensional discrete piecewise polynomial convolution kernels are low-pass filters including n+1 pieces.

53. The computer software of claim 52, wherein the function includes n+2 non-zero elements, the n+2 non-zero elements being proportional to $[(-1)^j(n+1)!]/[j!(n+1-j)!]$ for integral values of 'j' between 0 and n+1 inclusive, and the non-zero elements of the function being separated by 's' zero elements, where 's' is at least 0.

54. The computer software of claim 53, wherein 's' is a selectable parameter.

55. The computer software of claim 54, wherein n=2, and the function includes four non-zero elements, the four non-zero elements being proportional to 1, −3, 3, and −1, respectively.

56. The computer software of claim 53, wherein 'n' is a selectable parameter.

57. The computer software of claim 46, wherein the family of related one-dimensional discrete piecewise polynomial convolution kernels are low-pass filters including no more than one piece.

58. The computer software of claim 57, wherein n=2;

's' is a selectable parameter, wherein 's' is an integer at least equal to zero;

the function includes first, second, third, and fourth non-zero elements, the non-zero elements being proportional to (s+1), −(s+3), (s+3), and −(s+1) respectively; and the function includes 's' zero elements between the second non-zero element and the third non-zero element.

59. The computer software of claim 46, wherein the family of related one-dimensional discrete piecewise polynomial convolution kernels are band-pass filters including n+2 pieces.

60. The computer software of claim 59, wherein n =2;

's' is a selectable parameter, where 's' is an integer equal to at least zero;

the function includes five non-zero elements proportional to 1, −4, 6, −4, and 1 respectively; and the non-zero elements of the function are separated by 's' zero elements.

61. Computer software, residing on a computer-readable storage medium, including instructions for use in a computer system to digitally process a multi-dimensional signal, the instructions for causing:

for at least one dimension of the multi-dimensional signal, convolving the multi-dimensional signal along the dimension with a one-dimensional function that is the $(n+1)^{th}$ difference of an $n^{th}$ order discrete piecewise polynomial kernel so as to provide a second multi-dimensional digital signal, 'n' being at least 2, each polynomial kernel having at least one non-linear piece, each function having fewer non-zero elements than the corresponding polynomial kernel has non-zero elements; and for each convolved dimension, discretely integrating the second multi-dimensional digital signal n+1 times along the convolved dimension to produce a processed multi-dimensional signal, where 'n' is the order of the polynomial kernel corresponding to the convolved dimension.

62. The computer software of claim 61, where convolving includes performing computations that involve only non-zero elements of the corresponding function.

63. Computer software, residing on a computer-readable storage medium, including instructions for use in a computer system to digitally process a multi-dimensional signal so as to provide for adjustment over a range of performance characteristics, the instructions for causing:

for at least one dimension of the multi-dimensional signal, providing a corresponding family of related one-dimensional discrete piecewise polynomial convolution kernels, the convolution kernels being specified by at least one selectable parameter, a plurality of the convolution kernels being at least $2^{nd}$ order piecewise polynomials, and for a plurality of convolution kernels, each convolution kernel having more non-zero elements than its $(n+1)^{th}$ difference, where 'n' is the order of the convolution kernel;

for each family, selecting said at least one selectable parameter based on desired performance characteristics, thereby selecting a convolution kernel determined by said at least one selectable parameter, the convolution kernel being of order 'n';

for each family, convolving the digital multi-dimensional signal along a corresponding dimension with a function that is the $(n+1)^{th}$ difference of the convolution kernel so as to provide a second multi-dimensional digital signal; and for each family, performing discrete integration n+1 times along the corresponding dimension of the second multi-dimensional digital signal to produce a processed signal.

64. The computer software of claim 63, wherein a selectable parameter specifies the size of at least one convolution kernel.

65. The computer software of claim 63, wherein a selectable parameter determines the order 'n' of at least one convolution kernel.

66. The computer software of claim 63, wherein a selectable parameter determines the number of pieces of at least one convolution kernel.

67. The computer software of claim 63, the instructions also for causing:

using the at least one selectable parameter of at least one family to determine a normalization value; and using the normalization value to adjust the magnitude of the processed signal.

68. The computer software of claim 67, wherein the normalization value is proportional to the total combined weight of all of the selected convolution kernels.

69. Computer software, residing on a computer-readable storage medium, including instructions for use in a computer system to digitally process a digital image comprising rows and columns of data, the instructions for causing:

storing the digital image in a first memory;

providing (n+1) rows of column accumulators stored in a second memory;

providing (m+1) row accumulators stored in a third memory;

processing the digital image in a sequence of row coordinates;

for each row coordinate, selecting a fixed number of rows at fixed offsets from the row coordinate;

processing the selected rows in a sequence of column coordinates;

for each column coordinate, fetching from the first memory data stored at the column coordinate of each selected row;

multiplying data fetched from the first memory by corresponding coefficients and summing resulting products to produce a sequence of column values corresponding to the sequence of column coordinates, said coefficients being the non-zero elements of a function that is the $(n+1)^{th}$ difference of an $n^{th}$ order discrete piecewise polynomial kernel, 'n' being at least 2, the polynomial kernel having at least one non-linear piece, and where the function has fewer non-zero elements than the polynomial kernel has non-zero elements;

using the (n+1) rows of column accumulators to integrate the sequence of column values (n+1) times;

for each row coordinate, convolving the $(n+1)^{th}$ column accumulator with a function that is the $(m+1)^{th}$ difference of an $m^{th}$ order discrete piecewise polynomial kernel so as to provide a one-dimensional signal, 'm' being at least 2, the polynomial kernel having at least one non-linear piece, the function having fewer non-zero elements than the polynomial kernel has non-zero elements; and using the (m+1) row accumulators to integrate the one-dimensional signal (m+1) times to produce a processed image.

70. The computer software of claim 69, wherein the first memory provides sequential data access that is of higher speed than non-sequential access.

71. The computer software of claim 69, wherein the second memory provides sequential data access that is substantially as fast as non-sequential data access.

72. The computer software of claim 66, wherein the third memory provides data access at substantially zero access time cost.

73. Apparatus for digitally processing a one-dimensional signal, the apparatus comprising:

a convolver convolving the one-dimensional signal with a function that is the $(n+1)^{th}$ difference of an $n^{th}$ order discrete piecewise polynomial kernel so as to provide a second one-dimensional digital signal, 'n' being at least 2, the polynomial kernel having at least one non-linear piece, and the function having fewer non-zero elements than the polynomial kernel has non-zero elements; and an integrator, cooperative with the convolver, performing discrete integration n+1 times on the second one-dimensional digital signal to produce a processed signal.

74. The apparatus of claim 73, were convolving includes performing computations that involve only the non-zero elements of the function.

75. The apparatus of claim 73, wherein the $n^{th}$ order discrete piecewise polynomial kernel is a low-pass filter comprising n+1 pieces.

76. The apparatus of claim 75, wherein the function includes n+2 non-zero elements, the non-zero elements being proportional to $[(-1)^j(n+1)!]/[j!(n+1-j)!]$ for integral values of 'j' between 0 and n+1 inclusive, and the non-zero elements of the function being separated by 's' zeros, where 's' is greater than 0.

77. The apparatus of claim 76, wherein n=2, and the function includes four non-zero elements, the four non-zero elements being proportional to 1, −3, 3, and −1, respectively.

78. The apparatus of claim 73, wherein the $n^{th}$ order discrete piecewise polynomial kernel is a low-pass filter including no more than one piece.

79. The apparatus of claim 78, wherein n=2;

the function includes first, second, third, and fourth non-zero elements, the non-zero elements being proportional to (s+1), −(s+3), (s+3), and -(s+1) respectively, where 's' is an integer greater than zero; and the function includes 's' zero elements between the second non-zero element and the third non-zero element.

80. The apparatus of claim 73, wherein the $n^{th}$ order discrete piecewise polynomial kernel is a band-pass filter including n+2 pieces.

81. The apparatus of claim 80, wherein n =2;

the function includes five non-zero elements proportional to 1, −4, 6, −4, and 1 respectively; and the non-zero elements of the function are separated by 's' zero elements, where 's' is greater than 0.

82. Apparatus for digitally processing a one-dimensional signal so as to provide for adjustment over a range of performance characteristics, the apparatus comprising:

a source of a family of related one-dimensional discrete piecewise polynomial convolution kernels, wherein the convolution kernels are specified by at least one selectable parameter, wherein a plurality of the convolution kernels are at least $2^{nd}$ order piecewise polynomials, and wherein for a plurality of convolution kernels, each has more non-zero elements than its $(n+1)^{th}$ difference, where 'n' is the order of the convolution kernel;

a selector selecting, based on desired performance characteristics, said at least one selectable parameter, thereby selecting a convolution kernel determined by said at least one selectable parameter, the convolution kernel being of order n;

a convolver convolving the digital one-dimensional signal with a function that is the $(n+1)^{th}$ difference of the convolution kernel so as to provide a second one-dimensional digital signal; and an integrator performing discrete integration n+1 times on the second one-dimensional digital signal to produce a processed signal.

83. The apparatus of claim 82, wherein a selectable parameter determines the size of the convolution kernel.

84. The apparatus of claim 82, wherein a selectable parameter determines the order 'n' of the convolution kernel.

85. The apparatus of claim 82, wherein a selectable parameter determines the number of pieces of the convolution kernel.

86. The apparatus of claim 82, additionally comprising:

a determiner using the at least one selectable parameter to determine a normalization value; and an adjuster using the normalization value to adjust the magnitude of the processed signal.

87. The apparatus of claim 86, wherein the normalization value is proportional to the total weight of the selected convolution kernel.

88. The apparatus of claim 82, wherein the family of related one-dimensional discrete piecewise polynomial convolution kernels are low-pass filters including n+1 pieces.

89. The apparatus of claim 88, wherein the function includes n+2 non-zero elements, the n+2 non-zero elements being proportional to $[(-1)^j(n+1)!]/[j!(n+1-j)!]$ for integral values of 'j' between 0 and n+1 inclusive, and the non-zero elements of the function being separated by 's' zero elements, where 's' is at least 0.

90. The apparatus of claim 89, wherein 's' is a selectable parameter.

91. The apparatus of claim 90, wherein n=2, and the function includes four non-zero elements, the four non-zero elements being proportional to 1, −3, 3, and −1, respectively.

92. The apparatus of claim 89, wherein 'n' is a selectable parameter.

93. The apparatus of claim 82, wherein the family of related one-dimensional discrete piecewise polynomial convolution kernels are low-pass filters including no more than one piece.

94. The apparatus of claim 93, wherein n=2;

's' is a selectable parameter, wherein 's' is an integer at least equal to zero;

the function includes first, second, third, and fourth non-zero elements, the non-zero elements being proportional to (s+1), −(s+3), (s+3), and −(s+1) respectively; and the function includes 's' zero elements between the second non-zero element and the third non-zero element.

95. The apparatus of claim 82, wherein the family of related one-dimensional discrete piecewise polynomial convolution kernels are band-pass filters including n+2 pieces.

96. The apparatus of claim 95, wherein n=2;

's' is a selectable parameter, where 's' is an integer equal to at least zero;

the function includes five non-zero elements proportional to 1, −4, 6, −4, and 1 respectively; and the non-zero elements of the function are separated by 's' zero elements.

97. Apparatus for digitally processing a multi-dimensional signal, the apparatus comprising:

for at least one dimension of the multi-dimensional signal, a convolver convolving the multi-dimensional signal along the dimension with a one-dimensional function that is the $(n+1)^{th}$ difference of an $n^{th}$ order discrete piecewise polynomial kernel so as to provide a second multi-dimensional digital signal, 'n' being at least 2, each polynomial kernel having at least one non-linear piece, each function having fewer non-zero elements than the corresponding polynomial kernel has non-zero elements; and an integrator, for each convolved dimension, discretely integrating the second multi-dimensional digital signal n+1 times along the convolved dimension to produce a processed multi-dimensional signal, where 'n' is the order of the polynomial kernel corresponding to the convolved dimension.

98. The apparatus of claim 97, wherein the convolver includes a computational element performing computations that involve only non-zero elements of the corresponding function.

99. Apparatus for digitally processing a multi-dimensional signal so as to provide for adjustment over a range of performance characteristics, the apparatus comprising:

a kernel source, for at least one dimension of the multi-dimensional signal, providing a corresponding family of related one-dimensional discrete piecewise polynomial convolution kernels, the convolution kernels being specified by at least one selectable parameter, a plurality of the convolution kernels being at least $2^{nd}$ order piecewise polynomials, and for a plurality of convolution kernels, each convolution kernel having more non-zero elements than its $(n+1)^{th}$ difference, where 'n' is the order of the convolution kernel;

a selector, for each family, selecting said at least one selectable parameter based on desired performance characteristics, thereby selecting a convolution kernel determined by said at least one selectable parameter, the convolution kernel being of order 'n';

a convolver, for each family, convolving the digital multi-dimensional signal along a corresponding dimension with a function that is the $(n+1)^{th}$ difference of the convolution kernel so as to provide a second multi-dimensional digital signal; and for each family, performing discrete integration n+1 times along the corresponding dimension of the second multi-dimensional digital signal to produce a processed signal.

100. The apparatus of claim 99, wherein a selectable parameter specifies the size of at least one convolution kernel.

101. The apparatus of claim 99, wherein a selectable parameter determines the order 'n' of at least one convolution kernel.

102. The apparatus of claim 99, wherein a selectable parameter determines the number of pieces of at least one convolution kernel.

103. The apparatus of claim 99, additionally comprising:

a determiner, using the at least one selectable parameter of at least one family to determine a normalization value; and an adjuster, using the normalization value to adjust the magnitude of the processed signal.

104. The apparatus of claim 103, wherein the normalization value is proportional to the total combined weight of all of the selected convolution kernels.

105. Apparatus for processing a digital image comprising rows and columns of data, the apparatus comprising:

first memory storing the digital image;

a second memory storing (n+1) rows of column accumulators;

a third memory storing (m+1) row accumulators;

a processor processing the digital image in a sequence of row coordinates;

a selector, for each row coordinate, selecting a fixed number of rows at fixed offsets from the row coordinate;

a processor processing the selected rows in a sequence of column coordinates;

a fetcher, for each column coordinate, fetching from the first memory data stored at the column coordinate of each selected row;

a multiplier multiplying data fetched from the first memory by corresponding coefficients and summing resulting products to produce a sequence of column values corresponding to the sequence of column coordinates, said coefficients being the non-zero elements of a function that is the $(n+1)^{th}$ difference of an $n^{th}$ order discrete piecewise polynomial kernel, 'n' being at least 2, the polynomial kernel having at least one non-linear piece, and where the function has fewer non-zero elements than the polynomial kernel has non-zero elements;

an integrator using the (n+1) rows of column accumulators to integrate the sequence of column values (n+1) times;

a convolver, for each row coordinate, convolving the $(n+1)^{th}$ column accumulator with a function that is the $(m+1)^{th}$ difference of an mth order discrete piecewise polynomial kernel so as to provide a one-dimensional signal, 'm' being at least 2, the polynomial kernel having at least one non-linear piece, the function having fewer non-zero elements than the polynomial kernel has non-zero elements; and an integrator, using the (m+1) row accumulators to integrate the one-dimensional signal (m+1) times to produce a processed image.

106. The apparatus of claim 105, wherein the first memory provides sequential data access that is of higher speed than non-sequential access.

107. The apparatus of claim 105, wherein the second memory provides sequential data access that is substantially as fast as non-sequential data access.

108. The apparatus of claim 105, wherein the third memory provides data access at substantially zero access time cost.

* * * * *